(12) United States Patent
Ishii

(10) Patent No.: US 8,092,075 B2
(45) Date of Patent: Jan. 10, 2012

(54) AGITATION/DEAERATION DEVICE

(75) Inventor: Hiroshige Ishii, Tokyo (JP)

(73) Assignee: Thinky Corporation, Tokyo (JP)

( * ) Notice: Subject to any disclaimer, the term of this patent is extended or adjusted under 35 U.S.C. 154(b) by 732 days.

(21) Appl. No.: 10/571,351

(22) PCT Filed: Jul. 5, 2004

(86) PCT No.: PCT/JP2004/009880
§ 371 (c)(1),
(2), (4) Date: Mar. 10, 2006

(87) PCT Pub. No.: WO2005/025717
PCT Pub. Date: Mar. 24, 2005

(65) Prior Publication Data
US 2007/0025180 A1 Feb. 1, 2007

(30) Foreign Application Priority Data
Sep. 11, 2003 (JP) ................. 2003-319690

(51) Int. Cl.
*B01F 11/00* (2006.01)
*B01F 15/02* (2006.01)
(52) U.S. Cl. .............. 366/139; 366/144; 366/175.3; 366/217; 366/218; 494/18
(58) Field of Classification Search .......... 366/139, 366/217, 219, 232, 175.3, 144, 218, 221, 366/180.1; 494/18, 77
See application file for complete search history.

(56) References Cited

U.S. PATENT DOCUMENTS

| | | | | |
|---|---|---|---|---|
| 1,661,681 A | * | 3/1928 | Rood | 366/130 |
| 3,230,723 A | * | 1/1966 | Korn | 62/3.6 |
| 3,411,755 A | * | 11/1968 | Strauss et. al. | 366/145 |
| 3,575,224 A | * | 4/1971 | Hughes | 241/185.5 |

(Continued)

FOREIGN PATENT DOCUMENTS

JP 62210009 A * 9/1987

(Continued)

OTHER PUBLICATIONS

Machine translations (JPO) of JP 2001-246236 A and JP 10-225602 A, generated Nov. 30, 2009 and Nov. 24, 2009 respectively.*

*Primary Examiner* — Tony G Soohoo
(74) *Attorney, Agent, or Firm* — Berenato & White, LLC

(57) ABSTRACT

An agitation/deaeration apparatus is provided which causes a container containing a viscous to-be-kneaded object to be rotated and revolved simultaneously, to agitate and deaerate the to-be-kneaded object, wherein piping (wiring) connecting the container and an external device is prevented from twisting even when the container rotates. In an agitation/deaeration apparatus (1A) which performs agitation and deaeration of a to-be-kneaded object (K) by causing a container (9) accommodating a to-be-kneaded object (K) to be rotated about a rotation axis (Y2) of the container (9) and revolved about a revolution axis (Y2), provided are: a first rotation drive mechanism (motor 5) configured to drive and rotate a revolution table (7); a second rotation drive mechanism (a round-belt groove 3$d$, a pulley P3) configured to rotate the container (9) in a reverse direction at the same rotational speed relative to the revolution table (7); one or more of distribution means (a suction tube 8) of which one end is connected with the container (9) and the other end is connected with the external device.

12 Claims, 6 Drawing Sheets

U.S. PATENT DOCUMENTS

| | | | | |
|---|---|---|---|---|
| 3,586,413 A | * | 6/1971 | Adams | 359/503 |
| 3,679,184 A | * | 7/1972 | Woodham et al. | 366/219 |
| 3,830,475 A | * | 8/1974 | Inoue et al. | 366/145 |
| 3,986,337 A | * | 10/1976 | Richard | 62/3.3 |
| 3,986,442 A | * | 10/1976 | Khoja et al. | 475/182 |
| 4,041,648 A | * | 8/1977 | Heiberger | 451/329 |
| 4,092,138 A | * | 5/1978 | Beitner | 433/32 |
| 4,113,173 A | * | 9/1978 | Lolachi | 494/18 |
| 4,120,449 A | * | 10/1978 | Brown et al. | 494/18 |
| 4,216,770 A | * | 8/1980 | Cullis et al. | 604/6.02 |
| 4,277,183 A | * | 7/1981 | Shinriki | 366/98 |
| 4,283,004 A | * | 8/1981 | Lamadrid | 494/18 |
| 4,296,882 A | * | 10/1981 | Kobayashi | 494/18 |
| 4,425,112 A | * | 1/1984 | Ito | 494/18 |
| 4,540,397 A | * | 9/1985 | Lolachi et al. | 494/84 |
| 4,586,292 A | * | 5/1986 | Carroll et al. | 451/329 |
| 4,710,161 A | * | 12/1987 | Takabayashi et al. | 494/84 |
| 4,728,197 A | | 3/1988 | Reinhard | 366/219 |
| 4,806,252 A | * | 2/1989 | Brown et al. | 210/744 |
| 5,104,232 A | * | 4/1992 | Lennox, III | 366/227 |
| 5,167,448 A | * | 12/1992 | Herold et al. | 366/213 |
| 5,257,862 A | * | 11/1993 | Gardner | 366/139 |
| 5,316,667 A | * | 5/1994 | Brown et al. | 210/85 |
| 5,352,037 A | * | 10/1994 | Jouvin | 366/219 |
| 5,360,542 A | * | 11/1994 | Williamson et al. | 210/232 |
| RE35,276 E | * | 6/1996 | Chan | 366/139 |
| 5,529,567 A | * | 6/1996 | Toth et al. | 494/7 |
| 5,551,779 A | * | 9/1996 | Gantner et al. | 366/217 |
| 5,961,842 A | * | 10/1999 | Min et al. | 210/745 |
| 5,996,634 A | * | 12/1999 | Dennehey et al. | 138/109 |
| 6,709,151 B2 | * | 3/2004 | Schmidt | 366/219 |
| 6,733,170 B2 | * | 5/2004 | Mukasa et al. | 366/139 |
| 7,201,512 B2 | * | 4/2007 | Suzuki et al. | 366/217 |
| 2002/0172091 A1 | * | 11/2002 | Hatakeyama | 366/144 |
| 2003/0060352 A1 | * | 3/2003 | Dolecek et al. | 494/18 |
| 2003/0067838 A1 | * | 4/2003 | Schmidt | 366/219 |
| 2003/0103409 A1 | * | 6/2003 | Mukasa et al. | 366/139 |
| 2004/0066706 A1 | * | 4/2004 | Barker et al. | 366/139 |
| 2009/0207688 A1 | * | 8/2009 | Flackett | 366/139 |
| 2009/0281663 A1 | * | 11/2009 | Robida | 700/265 |

FOREIGN PATENT DOCUMENTS

| | | | |
|---|---|---|---|
| JP | 7-289873 A | | 11/1995 |
| JP | 09029086 A | * | 2/1997 |
| JP | 09047649 A | * | 2/1997 |
| JP | 09108558 A | * | 4/1997 |
| JP | 10043566 A | * | 2/1998 |
| JP | 10043567 A | * | 2/1998 |
| JP | 10043568 A | * | 2/1998 |
| JP | 10225602 A | * | 8/1998 |
| JP | 11-104404 A | | 4/1999 |
| JP | 11226375 A | * | 8/1999 |
| JP | 11226376 A | * | 8/1999 |
| JP | 11-290668 A | | 10/1999 |
| JP | 11309358 A | * | 11/1999 |
| JP | 2000271465 A | * | 10/2000 |
| JP | 2001246236 A | * | 9/2001 |
| JP | 2001276592 A | * | 10/2001 |
| JP | 2003093862 A | * | 4/2003 |
| JP | 2003-201000 A | | 7/2003 |

* cited by examiner

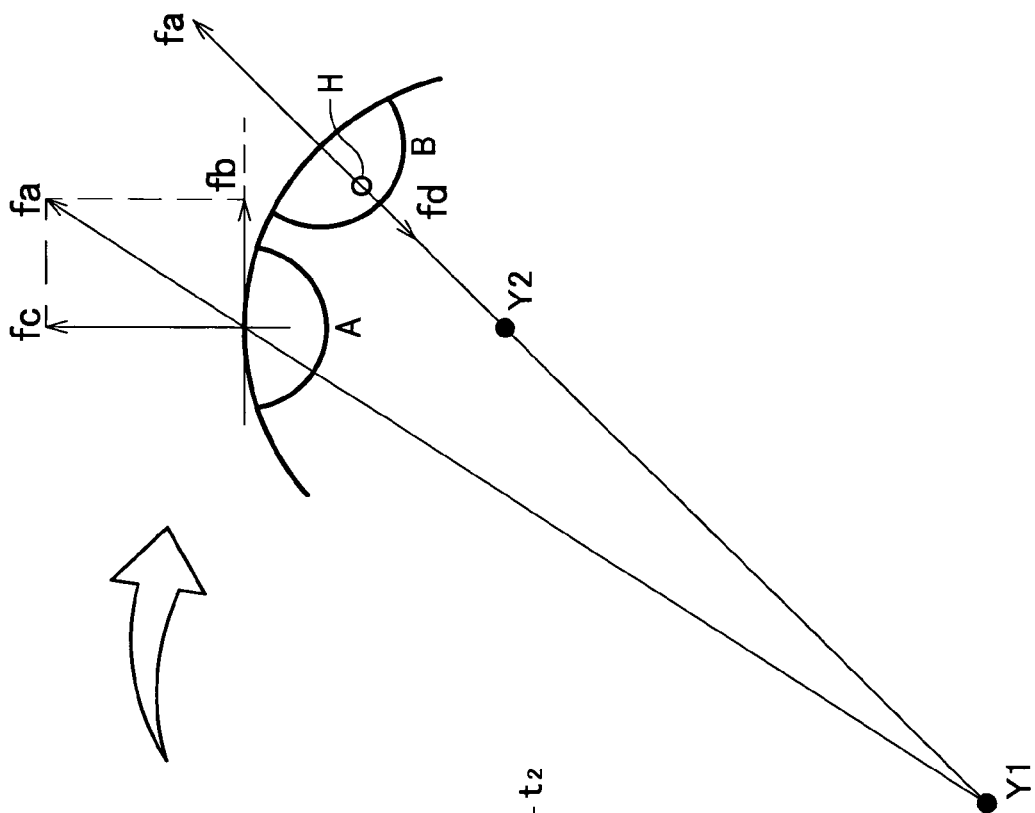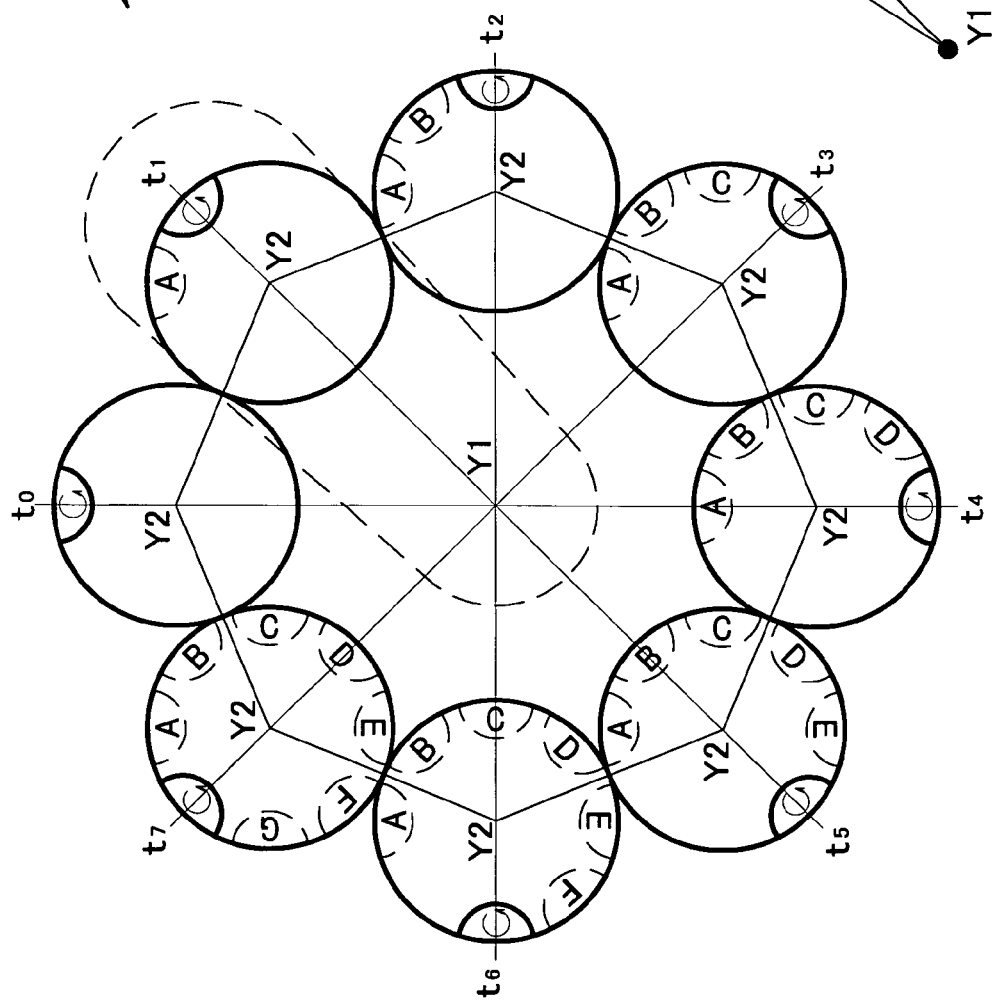

AGITATION/DEAERATION DEVICE

TECHNICAL FIELD

This invention relates to an agitation/deaeration apparatus which revolves, and rotates at the same time, a container accommodating viscous fluid materials, such as a solder paste, an impression material for dentistry, and a liquid crystal material (hereinafter referred to as "to-be-kneaded object"), and thereby agitates and deaerates the to-be-kneaded object, and more particularly to an agitation/deaeration apparatus in which a container to be rotated is connected with an external device through wiring or piping.

BACKGROUND ART

An agitation/deaeration apparatus in which a container containing a to-be-kneaded object is revolved, and rotated in a revolution orbit, has been hitherto known in the art.

This type of the agitation/deaeration apparatus is configured to press a to-be-kneaded object against an interior wall of the container centrifugally by the action of revolution of the container, thus releasing bubbles incorporated in the to-be-kneaded object to the outside (deaerating), and to agitate the to-be-kneaded object by the action of rotation of the container, at the same time. For the purpose of achieving desired effects, such as promotion of deaeration and agitation of the to-be-kneaded object, an external device may be connected with the container to be rotated, through wiring or piping, in some instances.

FIG. 6 illustrates such an instance where an external device is connected with a container 109 of an agitation/deaeration apparatus 101; particularly, the external device connected therewith is a pressure-reducing means 120 for reducing a pressure in the container. Herein, the container 109 is gastight so that a to-be-kneaded object K included in a sample holder 109$d$ is sealed therein. At the center of a top lid 109$b$ thereof is provided a fixed attachment part 109$e$ having an opening to which an end of a suction tube 108 made of a hollow flexible hose is fixed. At the center of an undersurface of a container body 109$a$, a rotation shaft of a rotating means (not shown) is provided and connected thereto so that the container 109 is rotated about a rotation axis Y2. Further, this rotating means is placed in a revolving means (not shown) so that the container 109 revolves about a revolution axis Y1 in a revolution orbit X.

A vacuum pump 122 and the container 109 are connected together through a rotary joint 108$a$ by which the suction tube 108 and a vacuum suction hose 121 are rotatable relative to each other (for example, see JP11-290668 A, paragraphs 0030-0035, FIG. 3). The rotary joint 108$a$ is comprised of pipes joined together so that the pipes are coaxially rotatable relative to each other while its joint portion is adapted to prevent outside aeriform fluids from entering inside therethrough under atmospheric pressure even when the inside of the pipes is under reduced pressure.

As described above, previously, joint of an external device (pressure-reducing means in this instance) with the container 109 to be rotated is achieved by providing a rotary joint 108$a$ or any other member which permits pipes coupled with its ends to rotate relative to each other, at some midpoint in the suction tube 108.

However, the use of a standard rotary joint 108$a$ provided at a midpoint in such a coupling member would disadvantageously suffer from a limitation of vacuum level (to an extent of a few torr or so) achieved by reduction in pressure inside the container 109 in which the to-be-kneaded object K is included. This is because leakage of atmospheric gases into the suction tube 108 cannot completely be prevented even if sealing for ensuring gastightness is provided at a portion where the rotary joint 108$a$ slides to rotate. The use of an alternative rotary joint having a special structure such as those which adopt a scheme using a magnetic fluid could carry out agitation/deaeration in a higher degree of vacuum, but would hardly be applicable in view of its cost and size.

Assuming an application to a technical field in which a sensor or the like is provided in the container 109 to be rotated for determining physical properties of the to-be-kneaded object K during a kneading operation, which are observed with an external device, a feeble analog signal sensed by the sensor could be passed through a sliding contact inside the rotary joint 108$a$, and transmitted to the external device. Noises that could be produced at the sliding contact, however, would be transmitted too, with the result that a signal-to-noise ratio of the detected signal would disadvantageously decrease.

Therefore, it is an object of the present invention to solve the aforementioned problems, and to provide an agitation/deaeration apparatus which is configured to rotate a container without causing tubes (wires) for connecting the container and an external device to become twisted.

DISCLOSURE OF INVENTION

In one aspect of the present invention, an agitation/deaeration apparatus which causes a hermetically sealable container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a vacuum pump configured to reduce a pressure in the container; and a suction tube connecting the vacuum pump and the container, wherein the suction tube has a fixed midsection prevented from rotating relative to the support member, and has a torsional rigidity sufficient to restrain the container from rotating.

In this arrangement, as the revolution table rotates, the container revolves in a revolution orbit, and the to-be-kneaded object contained therein is thereby subjected to its centrifugal force. Bubbles incorporated in the to-be-kneaded object are then subjected to a buoyant force deviated in a direction reverse to that of the centrifugal force (i.e., direction centripetal toward the revolution axis). The bubbles subjected to thus-deviated force move against a viscosity of the to-be-kneaded object toward the revolution axis, and removed at the surface of the to-be-kneaded object, so that the to-be-kneaded object is eventually deaerated. On the other hand, the container is restricted from rotating relative to the support member irrespective of rotation of the revolution table because the suction tube connected thereto has a high degree of torsional rigidity. It is however to be understood that the container as viewed from the rotating revolution table is rotating about its rotation axis at a speed equal to the rotational speed of the revolution table, though the rotational speed of the container relative to the support member is zero. Specifically, while the container makes one revolution in the revolution orbit, the container makes one rotation about its rotation axis on the revolution table. Taking a look at the to-be-kneaded object contained in the container, as the container rotates, the to-be-kneaded object moves relatively along the interior wall of the container, and agitation of the to-be-kneaded object proceeds. This agitation causes the to-be-kneaded object composed of mixtures having two or more components to be mixed evenly, and powder if added thereto to be dispersed evenly in a high-viscosity matrix.

The vacuum pump, when actuated, reduces the pressure in the container, and causes the bubbles incorporated in the to-be-kneaded object to expand, thus increasing the buoyant force acting on the bubbles. Accordingly, the movement of the bubbles against the viscosity of the to-be-kneaded object toward the revolution axis is accelerated, and the deaeration is promoted so that it may finish in a shorter period of time. When the suction tube has a midsection fixed on a line extended from the revolution axis, the center of revolution about which the container revolves coincides with the fixed position, and thus the stress produced in conjunction with revolution is not directed toward the longitudinal direction of the hose. It is to be noted that this fixed position is not necessarily located on the line extended from the revolution axis in the strict sense of the term, and some deviation may be allowed within a permissible range of design changes.

In another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object includes: a revolution table having bearings with which the container is supported rotatably about the rotation axis; a support member with which the revolution table is supported rotatably about the revolution axis; a first rotation drive mechanism configured to drive and rotate the revolution table; a coupling member having one end and the other end, the one end being coupled with the container, the other end being fixed near a line extended from the revolution axis and prevented from rotating relative to the support member; a supply device configured to supply the to-be-kneaded object to the container; a collection device configured to collect the kneaded object from the container; a supply tube connecting the container and the supply device; and a collection tube connecting the container and the collection device, wherein the coupling member has a torsional rigidity sufficient to restrain the container from rotating.

In this arrangement, by the action of the coupling member, the container is allowed to rotate relative to the revolution table for agitation and deaeration of the to-be-kneaded object, but restricted from rotating relative to the support member. Accordingly, when the apparatus is actuated with a flexible tube from an external device, which includes the supply tube and the collection tube from the supply device and the collection device respectively, being inserted in the container, these two tubes are prevented from twisting together. Consequently, the to-be-kneaded object which includes more than two kinds of pre-kneaded materials supplied from the supply device can be injected through the supply tube into the container, kneaded by the apparatus actuated, and thereafter the resulting kneaded object can be sucked from the container through the collection tube, and collected by the collection device. By repeating the operation as described above, supply of the to-be-kneaded object and collection of the kneaded object can be implemented without removing the top lid of the container, and kneading operation can be performed continuously.

In yet another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a coupling member having one end and the other end, the one end being coupled with the container, the other end being fixed near a line extended from the revolution axis and prevented from rotating relative to the support member; a medium passage formed in or provided on the container, through which a heat exchange medium is circulable; a medium circulating device configured to cause the heat exchange medium to circulate through the medium passage; and a medium distribution tube connecting the medium circulating device and the medium passage, wherein the coupling member has a torsional rigidity sufficient to restrain the container from rotating.

In this arrangement, by the action of the coupling member, the container is allowed to rotate relative to the revolution table for agitation and deaeration of the to-be-kneaded object, but restricted from rotating relative to the support member. Accordingly, when the apparatus is actuated with two flexible tubes of medium distribution tube from the medium circulating device provided outside being connected with the medium passage provided in or on the container, these two medium distribution tubes are prevented from twisting together. Consequently, the temperature-controlled heat exchange medium can be circulated through the container while the device is agitating/deaerating the to-be-kneaded object, so that the to-be-kneaded object can be maintained at a constant temperature. If the medium circulating device is configured to have a heat regulation capability, the working temperature of kneading operation for the to-be-kneaded object can be set as desired.

In yet another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a coupling member having one end and the other end, the one end being coupled with the container, the other end being fixed near a line extended from the revolution axis and prevented from rotating relative to the support member; one or more of distribution means having one end and the other end, the one end being coupled with the container, the other end being connected with an external device, wherein the coupling member has a torsional rigidity sufficient to restrain the container from rotating.

In this arrangement, by the action of the coupling member, the container is allowed to rotate relative to the revolution table for agitation and deaeration of the to-be-kneaded object, but restricted from rotating relative to the support member. Accordingly, when the apparatus is actuated with one or more of such flexible distribution means from an external device provided outside being coupled with the container, these two medium distribution tubes are prevented from twisting together. Hereupon, the distribution means is not limited to those which carry a medium in gaseous or liquid form, but includes any means capable of distributing everything, such as electricity and light, transmissible through a medium, generally encompassing wiring (a lead wire, an optical fiber), piping, and the like.

In yet another aspect of the present invention, an agitation/deaeration apparatus which causes a hermetically sealable container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a second rotation drive mechanism configured to drive and rotate the container in a direction reverse to that of the revolution table and at a rotational speed equal to that of the revolution table; a vacuum pump configured to reduce a pressure in the container; and a suction tube connecting the vacuum pump and the container.

In this arrangement, relative to the revolution table which is rotated by the first rotation drive mechanism, the container is rotated by the second rotation drive mechanism at a rotational speed equal to that of the revolution table and in a rotational direction reverse to that of the revolution table. Thus, the container is not rotated relative to the support member, and the suction tube connecting the container and the vacuum pump is prevented from twisting. Accordingly, the necessity of a rotary joint or the like to be provided at a midpoint in the suction tube is obviated, with the result that the atmosphere surrounding the to-be-kneaded object can be maintained under a higher degree of vacuum. Further, the volume to be subjected to pressure reduction is limited to a narrower space, i.e., only to the volumetric capacity of the container, the period of time required to achieve the higher degree of vacuum from the beginning of the pressure reduction can be shortened.

In yet another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a second rotation drive mechanism configured to drive and rotate the container in a direction reverse to that of the revolution table and at a rotational speed equal to that of the revolution table; a supply device configured to supply the to-be-kneaded object to the container; a collection device configured to collect the kneaded object from the container; a supply tube connecting the container and the supply device; and a collection tube connecting the container and the collection device.

In this arrangement, relative to the revolution table which is rotated by the first rotation drive mechanism, the container is rotated by the second rotation drive mechanism at a rotational speed equal to that of the revolution table and in a rotational direction reverse to that of the revolution table. Accordingly, the container is not rotated relative to the support member, and the supply tube and the collection tube connecting the container with the supply device and the collection device respectively are prevented from twisting together. Thus, kneading operation can be performed with the supply tube and the collection tube attached to the container, so that supply of the to-be-kneaded object and collection of the kneaded object can be implemented without removing the top lid of the container, and the kneading operation can be performed continuously.

In yet another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a second rotation drive mechanism configured to drive and rotate the container in a direction reverse to that of the revolution table and at a rotational speed equal to that of the revolution table; a medium passage formed in or provided on the container, through which a heat exchange medium is circulable; a medium circulating device configured to cause the heat exchange medium to circulate through the medium passage; and a medium distribution tube connecting the medium circulating device and the medium passage.

In this arrangement, relative to the revolution table which is rotated by the first rotation drive mechanism, the container is rotated by the second rotation drive mechanism at a rotational speed equal to that of the revolution table and in a rotational direction reverse to that of the revolution table. Accordingly, the container is not rotated relative to the support member, and two medium distribution tubes connecting the medium circulating device with the beginning end and the terminal end of the medium passage provided in the container are prevented from twisting together. Thus, kneading operation can be performed with the medium distribution tubes attached to the container, so that the kneading operation can be performed continuously while the heat exchange medium is being circulated around the container, i.e., with the temperature of the to-be-kneaded object being controlled.

In yet another aspect of the present invention, an agitation/deaeration apparatus which causes a container containing a to-be-kneaded object to be rotated about a rotation axis of the container and revolved about a revolution axis simultaneously, to agitate and deaerate the to-be-kneaded object, includes: a revolution table having bearings with which the container is supported rotatably about the rotation axis; a support member with which the revolution table is supported rotatably about the revolution axis; a first rotation drive mechanism configured to drive and rotate the revolution table; a second rotation drive mechanism configured to drive and rotate the container in a direction reverse to that of the revolution table and at a rotational speed equal to that of the revolution table; one or more of distribution means having one end and the other end, the one end being coupled with the container, the other end being connected with an external device.

In this arrangement, relative to the revolution table which is rotated by the first rotation drive mechanism, the container is rotated by the second rotation drive mechanism at a rotational speed equal to that of the revolution table and in a rotational direction reverse to that of the revolution table. Accordingly, the container is not rotated relative to the support member, and one or more of the distribution means connecting the container and the external device is prevented from twisting together.

In the above agitation/deaeration apparatus, preferably, the container may include a radiating fin disposed on an outer surface. In this arrangement, heat generated by kneading the to-be-kneaded object is dissipated immediately through the radiating fin to the outside of the container, so that a rise in temperature of the to-be-kneaded object can be prevented.

The above agitation/deaeration apparatus may preferably include a thermoregulator configured to regulate an atmospheric temperature around the container. In this arrangement, the temperature of atmosphere surrounding the container can be regulated using the thermoregulator. Thus, by setting the temperature of the atmosphere around the container to a moderately low degree, dissipation of heat generated by kneading the to-be-kneaded object to the outside can be facilitated through the radiating fin. In addition, the thermoregulator may be comprised of a blower fan which serves to circulate the atmosphere so as to promote dissipation of heat from the radiating fin in some instances.

Other features and advantageous effects of the present invention will become readily apparent from the embodiments described with reference to accompanying drawings.

BRIEF DESCRIPTION OF DRAWINGS

FIG. 3A is a schematic diagram for explaining an agitation/deaeration operation for a to-be-kneaded object.

FIG. 3B is a partially enlarged plan view of the container, for explaining a stress acting on a to-be-kneaded object.

MODE(S) FOR CARRYING OUT THE INVENTION

First Embodiment

Figure 1:
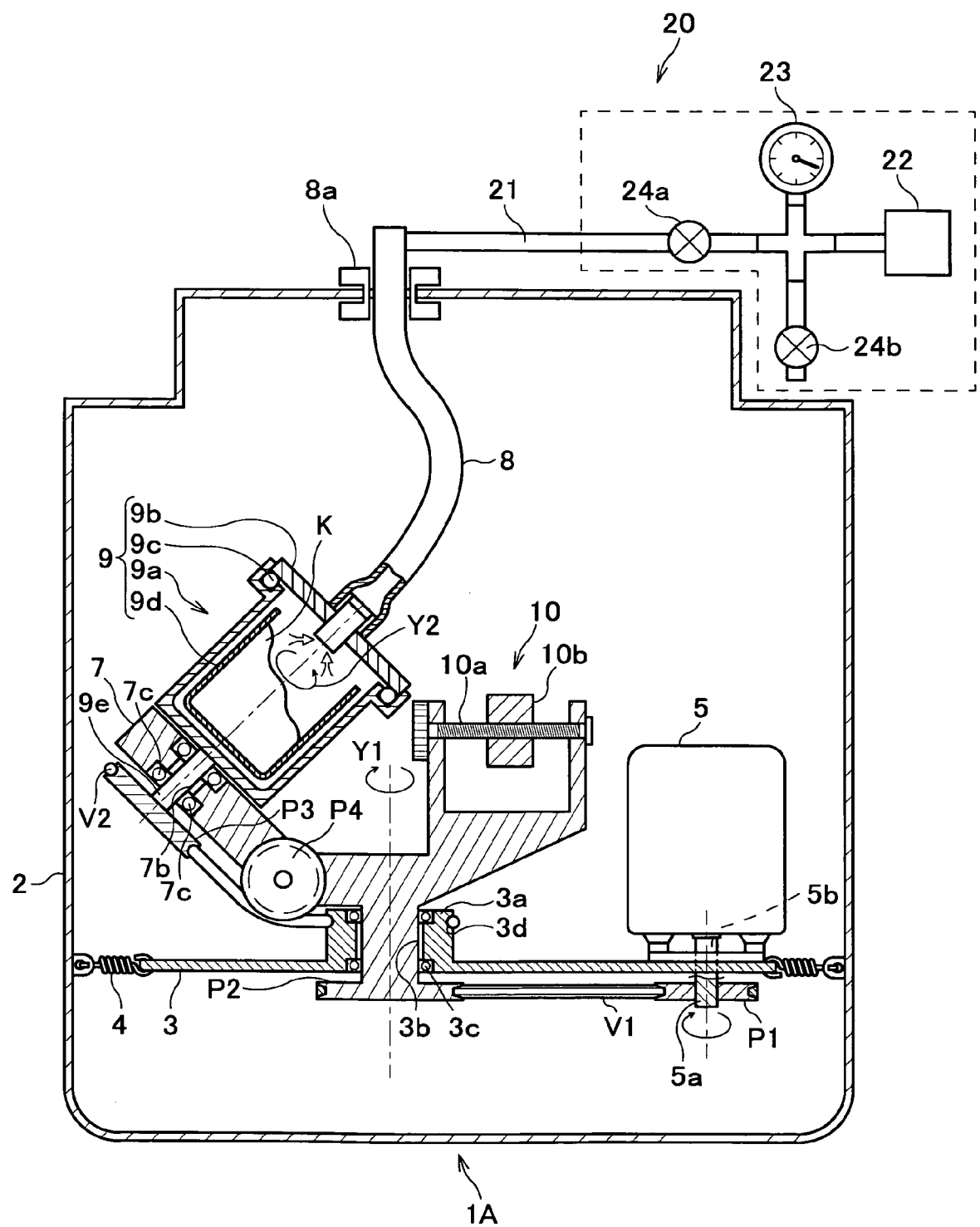
FIG. 1 is a longitudinal section showing an arrangement of an agitation/deaeration apparatus in which pressure reduction is possible according to a first embodiment.

A detailed description will now be given of the embodiments of the present invention with reference made to the drawings where appropriate. FIG. 1 is a longitudinal section showing an arrangement of an agitation/deaeration apparatus according to the first embodiment.

As shown in FIG. 1, an agitation/deaeration apparatus 1A includes a housing 2, a support member 3, a motor 5 (first rotation drive mechanism), a revolution table 7, a suction tube 8, a container 9, and a pressure-reduction means 20, and serves to cause the container 9 to make rotations as well as revolutions in a predetermined revolution orbit, so as to agitate and deaerate a to-be-kneaded object K contained in a sample holder 9d which is in turn contained in the container 9.

The motor 5 is fixed on the support member 3, and has a shaft 5a inserted in a through hole 5b of the support member 3 and protruded down through a bottom surface of the support member 3. A pulley P1 is fixed on a protruded end portion of the shaft 5a, and ganged together to rotate synchronously with the shaft 5a. The pulley P1 has a rim on which a belt V1 rests halfway around to transmit rotation of the motor 5 to the revolution table 7 which will be described below.

On the support member 3 is formed a projection 3a, and the revolution table 7 is supported rotatably with its own shaft through rotary bearings 3c in a bore 3b provided along a central axis of the projection 3a (the axis of rotation thereof will be hereinafter referred to as "revolution axis Y1"). In an upper portion of an outer cylindrical surface of the projection 3a is provided a round-belt groove 3d on which a round belt V2 circular in cross section, which will be described later, rests. On the other hand, a pulley P2 is fixed on a portion of the revolution table 7 protruded down through the bottom surface of the support member 3 so as to rotate synchronously with the revolution table 7. The pulley P2 has a rim on which the aforementioned belt V1 rests halfway around, so that the rotation of the motor 5 is transmitted via the pulleys P1 and P2 to the revolution table 7.

The support member 3 is held elastically by a plurality of springs 4 in the housing 2. By the action of the plurality of springs 4, vibrations induced by rotations of the motor 5, the revolution table 7 and the container 9 are absorbed, and thus are not transmitted to the housing 2. A hose draw-out hole 8a is formed on top of the housing 2 in a line extended from the revolution axis Y1, and the suction tube 8 is fixed therein with one end of the suction tube 8 is drawn out therethrough.

A portion of the revolution table 7 located above an upper surface of the support member 3 is provided with the container 9, a guide pulley P4 and a balance weight mount part 10.

The container 9 is comprised of a container body 9a, a top lid 9b and a sample holder 9d.

The container body 9a has a cylindrical shape with an open top and a closed bottom, and protrusively from a center of its undersurface, a support shaft 9e is provided of which an axial center coincides with a principal axis of the container 9. The support shaft 9e is inserted in a through hole 7b provided near an outer edge of the revolution table 7, and is allowed to rotate through rotary bearings 7c. Thus, the container 9 is supported rotatably with its own shaft relative to the revolution table 7 (the axis of rotation thereof will be hereinafter referred to as "rotation axis Y2"). The through hole 7b is disposed so that lines extended above from the revolution axis Y1 and the rotation axis Y2 intersect with each other. Therefore, the container 9 is invariably inclined inwardly at a specific angle toward the revolution axis Y1, with respect to the orbital plane of revolution of the container 9 as formed by rotation of the revolution table 7 about the revolution axis Y1.

A groove is formed along a brim or open end of the container body 9a, and an O-ring 9c is placed in this groove.

The top lid 9b is adapted to close the open top of the container body 9a. An outer edge of a bottom face of the top lid 9b and an end face of the container body 9a surrounding the opening are abutted against each other with the O-ring 9c held therebetween, and clamped by a pressing means (not shown), so that a joint portion is sealed hermetically. Accordingly, the inside of the container 9 is maintained in a gastight condition. The top lid 9b is provided with a through hole formed in a position on the rotation axis Y2, and one end of the suction tube 8 is coupled with the through hole.

The sample holder 9d is adapted to accommodate the to-be-kneaded object K inside, and disposed within the container body 9a in a detachable manner as well as a manner that prevents its relative rotation about the rotation axis Y2. After kneading operation by the agitation/deaeration apparatus 1A finishes, the kneaded object K contained in the sample holder 9d is taken out of the container body 9a, and collected. The sample holder 9d that has been used may be washed to render it reusable so that it may be used repeatedly, or may be thrown away, depending upon particular applications.

Since the rotation axis Y2 is inwardly inclined, the liquid surface of the to-be-kneaded object K uprising as shown in FIG. 1 due to the revolution of the container 9 would never come out of the sample holder 9d, thus arousing no fear of dirtying a joint portion between the container body 9a and the top lid 9b.

In the first embodiment, "second rotation drive mechanism" as defined in connection with the present invention is comprised of the round-belt groove 3d, the guide pulley P4, a pulley P3 and the round belt V2.

The pulley P3 is fixed at the end of the support shaft 9e protruding from the bottom surface of the revolution table 7, and configured to rotate synchronously with the container 9. The round belt V2 rests halfway around on the rim of the pulley P3 to transmit the rotation of the projection 3a which rotates relative to the revolution table 7.

The guide pulley P4 is rotatably supported with its shaft on a side of the revolution table 7, and has a rim configured to guide the route of the round belt V2 which is looped over the pulley P3 and the round-belt groove 3d. Although only one guide pulley P4 is illustrated in FIG. 1, it is to be understood that there is provided a pair of guide pulleys P4, and the other guide pulley P4 is disposed in a symmetrical position at the back side.

Meanwhile, the pulley ratio of the pulley P3 to the round-belt groove 3d is configured to be 1:1. Therefore, as the revolution table 7 rotates at a rotational speed x, the round-belt groove 3d rotates relative to the revolution table 7 at the rotational speed x. Further, the rotation of the round-belt groove 3d causes the container 9 to rotate relative to the revolution table 7 at the rotational speed x in a direction reverse to the direction of its revolution. To be more specific, the container 9 is rotated at the same rotational speed and in the reverse direction relative to the revolution table 7 which rotates relative to the support member 3. As will be described later, the rotation of the container 9 is such that the rotational speed is zero relative to the support member 3.

As described above, in the first embodiment, "second rotation drive mechanism" is conceived to utilize a motor 5 (first rotation drive mechanism) as a rotational drive power source. Alternatively, though not illustrated, the rotational drive power source of the second rotation drive mechanism may be independently provided on the support member 3 or on the revolution table 7.

The balance weight mount part 10 is provided in a position on the revolution table 7 symmetric to the container 9 with respect to the revolution axis Y1. The balance weight mount part 10 is comprised of a threaded member 10a on which a thread is provided along a radial direction of the revolution table 7, and a balance weight 10b screwed on and engaged with the threaded member 10a; a gravity center position is shifted along the radial direction by their screwing operations so that a rotation balance of the revolution table 7 is stabilized.

The pressure-reduction means 20 is comprised of a connection pipe 21, a vacuum pump 22, a vacuum gauge 23, a shutoff valve 24a and a leak valve 24b. One end of the connection pipe 21 is connected with the suction tube 8, and the pressure in the container 9 is reduced by the sucking action of the vacuum pump 22.

Next, an operation of the agitation/deaeration apparatus consistent with the present invention will be described with reference to FIGS. 1 and 2.

Figure 2:
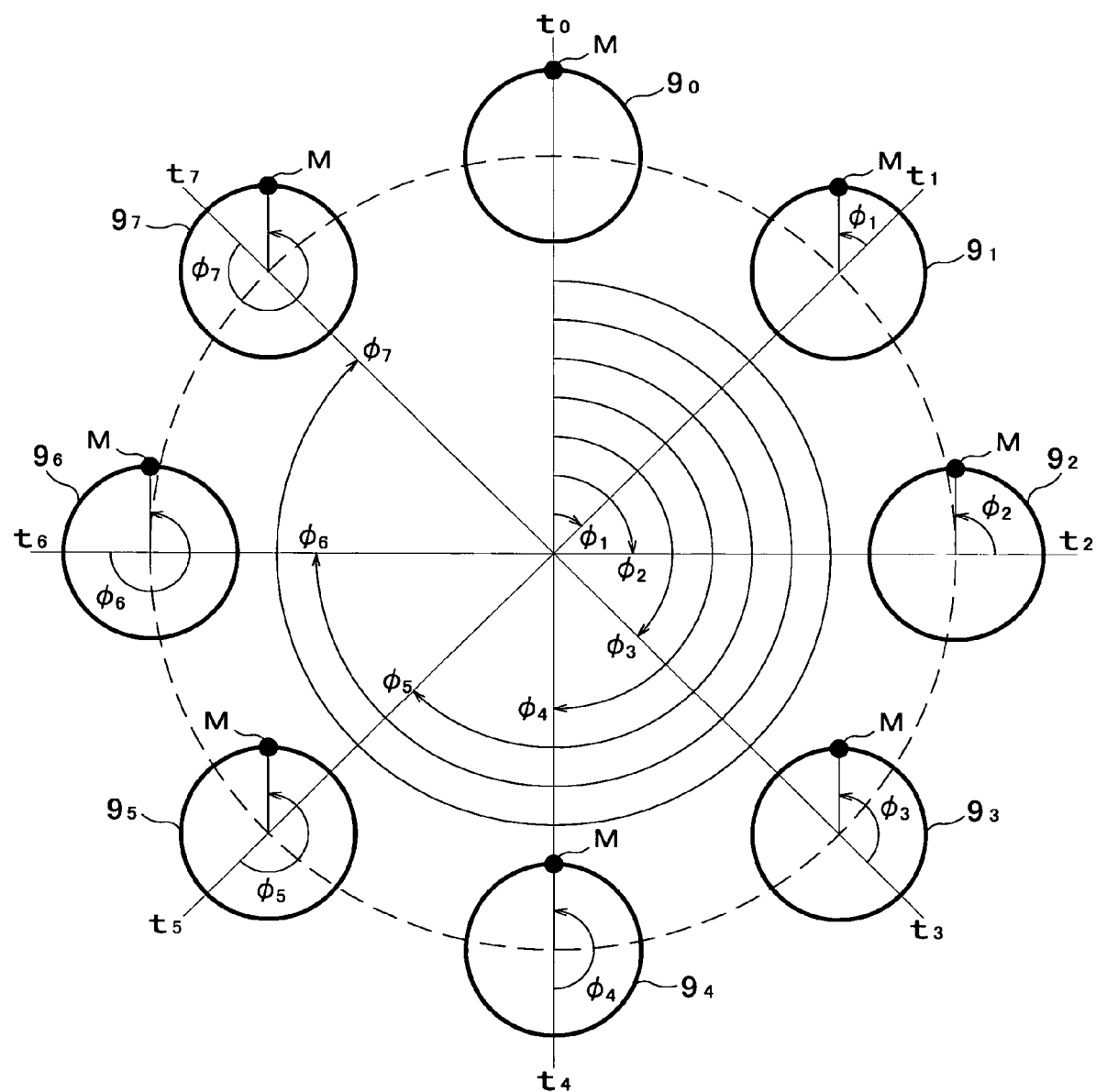
FIG. 2 is a schematic plan view of an agitation/deaeration apparatus consistent with the present invention, for explaining movement of a container containing a to-be-kneaded object.

FIG. 2 is a schematic plan view of an agitation/deaeration apparatus consistent with the present invention, for explaining movement of a container containing a to-be-kneaded object.

First, as the motor 5 is actuated to cause the pulley P1 to rotate, its rotation is transmitted through the belt V1 to the pulley P2, and causes the revolution table 7 to rotate. As the revolution table 7 rotates, the support member 3 and the projection 3a are deemed to rotate relatively from the viewpoint of the revolution table 7. This relative rotation of the projection 3a is transmitted through the round belt V2 to the pulley P3, and causes the container 9 to rotate. Since the pulley ratio of the round-belt groove 3d to the pulley P3 is 1:1, the rotation of the container 9 relative to the revolution table 7 is at the same rotational speed as that of the revolution table 7 and in a rotational direction reverse to that of the revolution table 7 relative to the support member 3.

The containers $9_0, 9_1, \ldots, 9_7$ shown in FIG. 2 represent positions of the container 9 at times $(t_0, t_1, \ldots, t_7)$ with ⅛ cycle intervals. That is, after a lapse of $t_1$ from $t_0$, the revolution table 7 rotates an angle $\phi_1$ relative to the support member 3 (clockwise in the figure). During the same period of time, the container $9_1$ rotates reversely at the same rotational speed relative to the revolution table 7, and thus rotates the angle $\phi_1$ in the reverse direction (counterclockwise in the figure).

Subsequently, after a lapse of $t_2$ from $t_0$, the rotation table 7 rotates an angle $\phi_2$ relative to the support member 3 (clockwise in the figure). Then, the container $9_2$ rotates the angle $\phi_2$ relative to the revolution table 7 in the reverse direction (counterclockwise in the figure). Similarly, at $t_3$, $t_4$ and later times on, rotations proceed. Now, taking a look at a mark M placed at one spot on the container 9, the container 9 is considered to make no rotation relative to the support member 3. Therefore, the suction tube 8 of which one end is connected with the container 9 and the other end is connected with the pressure-reduction means 20 provided outside is not caused to twist even during the kneading operation of the agitation/deaeration apparatus 1A.

Next, a description will be given of an agitation/deaeration operation for a to-be-kneaded object K with reference to FIG. 3 (and FIG. 1 where appropriate). FIG. 3A is a schematic diagram for explaining the agitation/deaeration operation for the to-be-kneaded object K. FIG. 3B is a partially enlarged plan view of the container, for explaining a stress acting on the to-be-kneaded object K.

First, the discussion will focus on the agitation. It is herein to be understood that the revolution table 7 is in uniform rotational motion, and assuming a centrifugal force produced by the rotation of the container 9 is negligible, the force applied horizontally to the to-be-kneaded object K can be considered to be only the centrifugal force produced by the revolution thereof.

Assume the to-be-kneaded object K is in a position A at $t_1$. As shown in FIG. 3B, the to-be-kneaded object K in the position A is subjected to a centrifugal force $f_a$ proportional to the square of the orbital speed of the container 9. The centrifugal force $f_a$ may be divided into a tangential component $f_b$ and its perpendicular component $f_c$. The component $f_c$, is cancelled out by reaction from the interior wall of the container 9, while the component $f_b$ exerts such an action as to force the to-be-kneaded object K to move circumferentially along the inner cylindrical surface of the container. Then, the to-be-kneaded object K starting at the position A is rotationally moved along the inner cylindrical surface until arriving at a position B where the force has no component $f_b$, which position B is on the extended line that connects Y1 and Y2.

The rotational movement of the to-be-kneaded object K continues at $t_2, t_3, \ldots$, as well, so that the to-be-kneaded object K rolls on consecutively while passing through positions C, D, ..., respectively. In this process, the agitation of the to-be-kneaded object K proceeds.

Next, the discussion will be directed to the deaeration. As shown in FIG. 3B, a bubble H is subjected to a stress, like a buoyant force $f_d$ in a direction reverse to the centrifugal force $f_a$, equivalent to a centrifugal force applied to a particular amount of the to-be-kneaded object K which amount corresponds to the volume of the bubble H that has thrust it away. By the action of the buoyant force $f_d$, the bubble H moves against the viscosity of the to-be-kneaded object K toward the revolution axis Y1, and is removed at the surface of the to-be-kneaded object K, so that the to-be-kneaded object is eventually deaerated.

Then, as the vacuum pump 22 is actuated and the internal pressure of the container 9 is reduced, the volume of the bubble H expands in that the volume increases in inverse proportion to the pressure (Boyle's law). Consequently, the buoyant force $f_d$ acting on the bubble H increased in volume also increases, and thus the movement of the bubble H toward the surface is accelerated, so that the deaeration is promoted.

Second Embodiment

Figure 4:
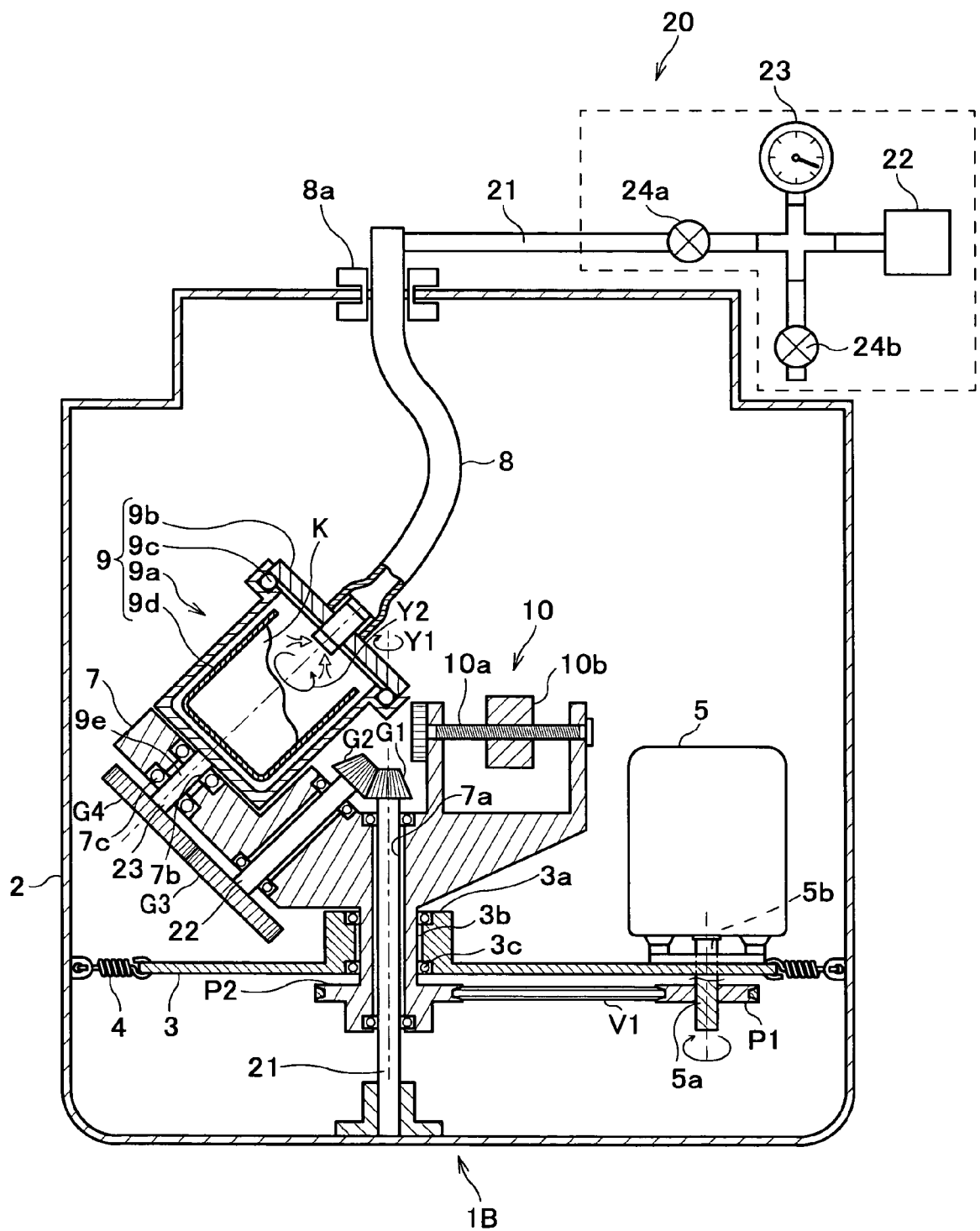
FIG. 4 is a longitudinal section showing an arrangement of an agitation/deaeration apparatus in which pressure reduction is possible according to a second embodiment.

Referring now to FIG. 4, a second embodiment of the present invention will be described. FIG. 4 is a longitudinal section showing an arrangement of an agitation/deaeration apparatus according to the second embodiment. Features of the agitation/deaeration apparatus 1B according to the second embodiment different from those of the apparatus 1A according to the first embodiment are that there are provided a rotation gear G4, a rotational force application shaft 21 and a rotational force transmission shaft 22 as shown in FIG. 4, instead of the pulley P3, the round-belt groove 3d and the guide pulley P4 as a rotation application mechanism for the container 9 in FIG. 1. In FIG. 4, the same components as in FIG. 1 are designated by the same reference numerals, and a detailed description thereof will not be given hereafter.

In the second embodiment, "second rotation drive mechanism" as defined in connection with the present invention is comprised of a rotational force application shaft 21, a rotational force transmission shaft 22 and rotation gears G1, G2, G3 and G4.

The rotational force application shaft 21 is inserted in a through hole 7a bored through the revolution table 7 along its revolution axis Y1, and has one end fixed on the housing 2 and the other end provided with a rotation gear G1 of a bevel-gear type. The rotational force application shaft 21 and the through hole 7a are supported through rotary bearings so that they are allowed to rotate relative to each other.

The rotational force transmission shaft 22 is disposed, parallel to the support shaft 9e, between the rotational force application shaft 21 and the support shaft 9e, and rotatable relative to the revolution table 7. The rotational force transmission shaft 22 has a lower end provided with a rotation gear G3 having the same number of teeth as a rotation gear G4, and an upper end provided with a rotation gear G2 of a bevel-gear type. These rotation gears G2 and G1 are in mesh, and thus as the revolution table 7 rotates relative to the support member 3 at a constant rotational speed x, the rotational force transmission shaft 22 rotates relative to the revolution table 7 at the rotational speed x and in the same direction.

The rotation gear G3 is configured to mesh with the rotation gear G4 having the same number of teeth provided at the lower end of the support shaft 9e, and to transmit its rotation to the container 9. The rotation of the container 9 has a rotational speed equal to and a direction reverse to the rotation of the rotational force transmission shaft 22. As a result, the container 9 rotates relative to the revolution table 7 at a rotational speed equal to that of the revolution table 7 and in a rotational direction reverse to that of the revolution table 7 rotating relative to the support member 3. Therefore, as described above using FIG. 2, when the agitation/deaeration apparatus 1B is actuated, the container 9 does not rotate relative to the support member 3 and the housing 2, and thus the suction tube 8 attached to the container is prevented from twisting.

The present embodiment as described above is presented for the purpose of illustrating the present invention by way of example, and the present invention is not limited to the described embodiment; therefore, various modifications may be made within the scope of essential features of the present invention. In the first and second embodiments, the external device connected with the container 9 is exemplified by the vacuum pump 22 which is directed to reduce the internal pressure of the container 9. However, it is conceivable that various applications of the present invention may be implemented by utilizing the feature of preventing piping (wiring) connecting the container 9 to an external device from twisting when a to-be-kneaded object K is subjected to agitation and deaeration.

For example, spiral piping (a medium passage) (not shown) through which a heat exchange medium such as cooling water is circulable may be provided on an inside or outside cylindrical surface of the container 9, wherein the both ends of the medium passage are connected through a flexible medium distribution tube (not shown) to an external device (a medium circulating device). In this arrangement, heat generated during kneading of the to-be-kneaded object K can be cooled, or if the medium circulating device has a temperature-regulating mechanism, the to-be-kneaded object can be kneaded under temperature control. The medium passage may be formed in the container 9 itself.

A variety of sensors (e.g., a temperature sensor, a CCD camera, or the like) (not shown) may be attached to the container 9, and a lead wire (distribution means) of the sensors may be connected to an externally provided detection device (external device) (not shown) without fear of causing the lead wire to twist. Accordingly, no rotary joint has to be provided at a midpoint in the distribution means, and a signal-to-noise ratio of the signal can be prevented from lowering. Consequently, observation of the to-be-kneaded object K during kneading process and measurement of various properties thereof can be realized with advantage.

Third Embodiment

Figure 5:
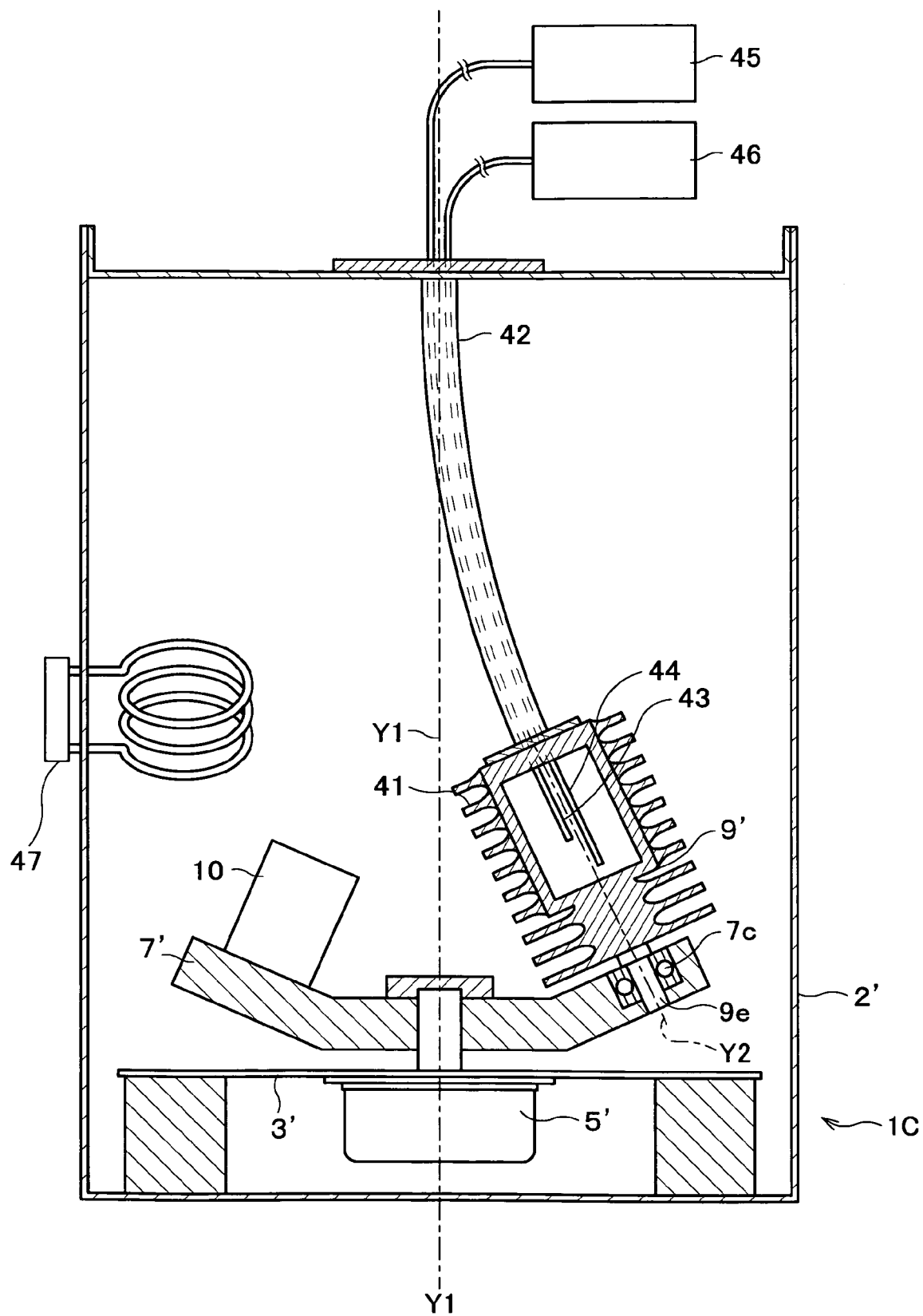
FIG. 5 is a longitudinal section showing an arrangement of an agitation/deaeration apparatus in which supply/collection of an object to be kneaded is possible according to a third embodiment.
Figure 6:
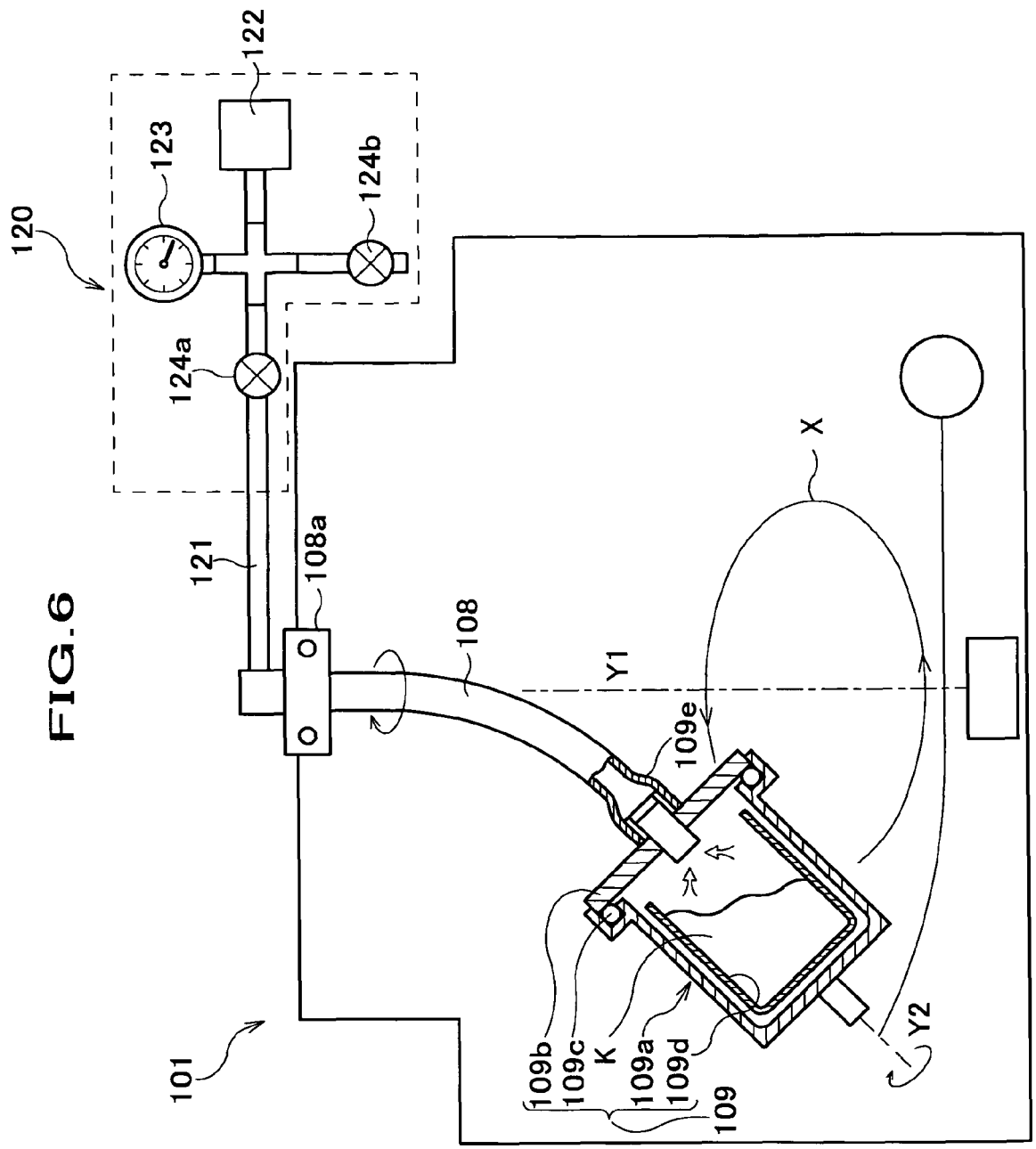
FIG. 6 is a longitudinal section showing an arrangement of a conventional agitation/deaeration apparatus in which pressure reduction is possible.

Referring now to FIG. 5, a third embodiment of the present invention will be described. FIG. 5 is a longitudinal section showing an arrangement of an agitation/deaeration apparatus according to the third embodiment. In FIG. 5, parts substantially the same as those in FIG. 1 are designated by the same reference characters with a prime symbol (') or dash mark affixed thereto, and a detailed description thereof will be omitted hereafter.

An agitation/deaeration apparatus 1C according to the third embodiment includes a revolution table 7' on which a container 9' is supported rotatably about a support shaft 9e through rotary bearings 7c, a motor 5' (first rotation drive mechanism) configured to drive and rotate the revolution table 7', a supply device 45, a collection device 46, a coupling member 42, and a thermoregulator 47. In this arrangement, the to-be-kneaded object K can be supplied to and the kneaded object K can be collected from the inside of the container 9' without detaching/attaching operation of a top lid (not shown) of the container 9'.

The coupling member 42 has one end coupled with the container 9' in the rotation axis Y2, and the other end coupled with the housing 2' in the revolution axis Y1. The coupling member 42 has a torsional rigidity sufficient to restrain the container 9' from rotating, so that the container 9' may not rotate relative to the housing 2' (combined integrally with the support member 3') even when the revolution table 7' rotates about the revolution axis Y1. By this action, the container 9' is restrained from rotating relative to the support member 2, too, and thus rotation of the container 9' can be made at an angular speed equal to that of the revolution table 7 and in a direction reverse to that of the revolution made by the revolution table 7'.

The supply device 45 is configured to thrust out a to-be-kneaded object K comprised of two or more components in a pre-kneaded raw-material state, which is supplied to the container 9'. The to-be-kneaded object K thrust out from the supply device 45 is passed through a supply tube 43 of which one end is disposed inside the container 9', and supplied to the container 9'.

The collection device 46 is configured to suck and collect the kneaded object K from the container 9' after kneading operation is completed. The kneaded object K is sucked through the collection tube 44 of which a terminal end is connected with the collection device 46, and a tip end is disposed inside the container 9', and submerged in the kneaded object K.

The supply tube 43 and the collection tube 44 have a midsection bound together within the coupling member 42 in FIG. 5, but do not necessarily have to be bound in a single piece, and may be provided independently. In either case, the supply tube 42 and the collection tube 44 connected with the container 9' have joint portions designed so as not to rotate relative to the support member 2, and would thus never twist together.

Radiating fins 41 are disposed on an outer cylindrical surface of the container 9', so that heat generated by kneading in the to-be-kneaded object K is dissipated through the radiating fins 41 to the outside of the container 9'.

The thermoregulator 47 is configured to lower the temperature of the atmosphere around the container 9' so that heat dissipation through the radiating fins 41 is carried out effectively. The thermoregulator 47 may be configured as shown in the figure to circulate a cooling medium through a spiral tube to thereby regulate the atmospheric temperature around the container 9', and may alternatively be configured to have a fan (not shown) blowing air to the radiating fins 41 to accelerate heat dissipation from the container 9'.

Next, referring to FIG. 5, a description will be given of an operation of the agitation/deaeration apparatus 1C according to the third embodiment. First, when the to-be-kneaded object K in a pre-kneaded state is put in the container 9', and the motor 5' is actuated to rotate the revolution table 7', the container 9' revolves and the deaeration of the to-be-kneaded object proceeds. Since the top portion of the container 9' is coupled with the top portion of the housing 2' through the coupling member 42 having a high torsional rigidity, the container 9' is prevented from rotating relative to the support member 3 during its revolution. In other words, with respect to the revolution table 7', the container 9' rotates at an angular speed equal to and in a direction reverse to the revolution, and the agitation of the to-be-kneaded object K proceeds.

After the to-be-kneaded object K has been sufficiently kneaded, the collection device 46 is actuated to suck the kneaded object K from the end of the collection tube 44. After the resulting kneaded object K has been sucked out, the supply device 45 is actuated, and another to-be-kneaded object K in a pre-kneaded raw-material state is supplied to the container 9'. Thereafter, the supplied to-be-kneaded object K is agitated and deaerated before it is collected by the collection device 46, and subsequently the aforementioned routine process is repeated.

Hereupon, agitation of the to-be-kneaded object K generates heat, and as kneading operation goes on, heat builds up and raises the temperature of the container 9'. However, this heat is dissipated through the radiating fins 41 to the outside of the container 9', which outside is maintained at a constant temperature by the thermoregulator 47; therefore, even if the kneading operation for the to-be-kneaded object 9' continues for a long period of time, the container 9' and the housing 2' are protected from becoming heated to high temperatures.

With the arrangement described above, in the agitation/deaeration apparatus 1C according to the third embodiment, supply and collection of the object K can be carried out without detaching/attaching operations of the top lid (not shown) of the container 9', and thus the kneading operation can be performed continuously, so that productivity of the kneaded object K is improved. Although there is apprehension that continuous kneading operation would build up heat in the container 9', thus-generated heat can be suppressed by the action of the radiating fins 41 and the thermoregulator 47.

Although the preferred embodiments of the present invention have been described above, various modifications and changes may be made in the present invention without departing from the scope thereof.

With the agitation/deaeration apparatuses consistent with the present invention, the following outstanding advantages can be achieved.

(1) In a particular setup where a vacuum pump is connected with the container, the container can be revolved and rotated relative to the orbital plane of revolution while the rotation of the container relative to a tube-fixed surface of the vacuum pump fails to take place. As a result, the inside pressure of the container can be reduced using a vacuum hose connected with the container while agitation/deaeration operation for a to-be-kneaded object is being carried out, so that the deaeration performance can be improved further. Moreover, the vacuum hose attached is prevented from twisting, and thus the necessity of providing a rotary joint at a midpoint therein is obviated, so that a high degree of vacuum can be provided in the container in a shortened period of time.

(2) In another setup where a supply device and a collection device are connected with the container, portions of a supply tube and a collection tube which are drawn out from the container are prevented from twisting. Therefore, supply of a to-be-kneaded object into and discharge of the kneaded object from the container can be carried out without detaching a top lid of the container, so that the continuous operation of kneading can be performed.

(3) Even if a medium passage through which a heat exchange medium is circulable is connected to the container, a medium distribution tube making up draw-out portions provided at the medium passage is prevented from twisting irrespective of rotation of the container. Therefore, in cases where a temperature of a to-be-kneaded object is to be controlled, the target of the temperature control is limited only to a small portion in the container accommodating the to-be-kneaded object; thus, greater controllability and improved energy efficiency can be achieved.

(4) The coupling member connected with the container which is in an agitation/deaeration operation is not rotated about a rotation axis relative to a mount surface on which the agitation/deaeration apparatus is installed. Accordingly, for example, a sensor or the like can be installed in the container to be rotated, so that a feeble analog signal from the sensor can be transmitted through wiring to the outside detector. Since the wiring is prevented from twisting, no rotary joint is required and the signal-to-noise ratio is prevented from lowering.

(5) In a setup where a radiating fin is provided, heat generated by kneading can be dissipated to the outside of the container swiftly.

INDUSTRIAL APPLICABILITY

The present invention may be applicable to an agitation/deaeration apparatus (rotation/revolution mixer) which performs agitation and deaeration by rotating and revolving a container accommodating viscous fluid materials used for a solder paste, an impression material for dentistry, a liquid crystal material, or the like. In particular, the present invention exerts advantageous effects which may solve some prior art problems by adopting to an agitation/deaeration apparatus in which a container to be rotated is connected with an external device through wiring or piping.

The invention claimed is:

1. An agitation/deaeration apparatus for simultaneously agitating and deaerating a to-be-kneaded object, comprising,
   a container which is hermetically sealable, comprising a container body in which the to-be-kneaded object is to be contained and a support axis fixed to the container body,
   a support member elastically jointed with a housing,
   a revolution table for rotatably supporting the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
   a first rotation drive mechanism configured to drive and rotate the revolution table;
   an external device; and
   a flexible tube without a rotary joint, the flexible tube having one end fixed to the container and the other end connected with the external device,
   wherein the flexible tube has a midsection which is fixed to the housing, and has a torsional rigidity sufficiently high to keep an orientation of the container constant relative to the support member while the container is simultaneously revolving about the revolution axis and rotating relative to the revolution table with the revolution table rotating.

2. An agitation/deaeration apparatus for simultaneously agitating and deaerating a to-be-kneaded object, comprising,
   a container comprising a container body in which the to-be-kneaded object is to be contained and a support axis fixed to the container body,
   a support member elastically jointed with a housing,
   a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
   a first rotation drive mechanism configured to drive and rotate the revolution table;
   a coupling member without a rotary joint, the coupling member having a first end and a second end, the first end being fixed to the container, the second end being fixed to a portion of the housing on or in a vicinity of a line extended from the revolution axis and prevented from rotating relative to the support member;
   a supply device configured to supply the to-be-kneaded object to the container;
   a collection device configured to collect the kneaded object from the container;
   a supply tube connecting the container and the supply device through inside the coupling member; and
   a collection tube connecting the container and the collection device through inside the coupling member,
   wherein the coupling member has a torsional rigidity sufficiently high to keep an orientation of the container constant relative to the support member while the container is simultaneously revolving about the revolution axis and rotating relative to the revolution table with the revolution table rotating.

3. An agitation/deaeration apparatus for simultaneously agitating and deaerating a to-be-kneaded object, comprising,
   a container comprising a container body in which the to-be-kneaded object is to be contained and a support axis fixed to the container body,
   a support member elastically jointed with a housing,
   a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
   a first rotation drive mechanism configured to drive and rotate the revolution table;
   a coupling member without a rotary joint, the coupling member having a first end and a second end, the first end being fixed to the container, the second end being fixed to a portion of the housing on or in a vicinity of a line extended from the revolution axis and prevented from rotating relative to the support member;
   a medium passage formed in or provided on the container, through which a heat exchange medium is circulable;
   a medium circulating device configured to cause the heat exchange medium to circulate through the medium passage; and
   a medium distribution tube connecting the medium circulating device and the medium passage through inside the coupling member,
   wherein the coupling member has a torsional rigidity sufficiently high to keep an orientation of the container constant relative to the support member while the container is simultaneously revolving about the revolution axis and rotating relative to the support member with the revolution table rotating.

4. An agitation/deaeration apparatus for simultaneously agitating and deaerating a to-be-kneaded object, comprising,
   a container comprising a container body in which the to-be-kneaded object is to be contained and a support axis fixed to the container body,
   a support member elastically jointed with a housing,
   a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
   a first rotation drive mechanism configured to drive and rotate the revolution table;
   a coupling member without a rotary joint having a first end and a second end, the first end being fixed to the container, the second end being fixed near a line extended from the revolution axis and prevented from rotating relative to the support member; and one or more distribution means through inside the coupling member having a first end and a second, the first end being coupled with the container, the other end being connected with an external device, wherein the coupling member has a torsional rigidity sufficiently high to keep an orientation of the container constant relative to the support member while the container is simultaneously revolving about the revolution axis and rotating relative to the support member with the revolution table rotating.

5. An agitation/deaeration apparatus for simultaneously agitating and deaerating a to-be-kneaded object, comprising,
- a container which is hermetically sealable, comprising a container body in which the to-be-kneaded object is to be contained and a support axis fixed to the container body,
- a support member elastically jointed with a housing,
- a revolution table for rotatably supporting the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
- a first rotation drive mechanism configured to drive and rotate the revolution table;
- a second rotation drive mechanism configured to drive and rotate the container in a direction reverse to that of the revolution table and at a rotational speed equal to that of the revolution table;
- an external device, and
- a flexible tube without a rotary joint, the flexible having a first end fixed to the container and a second end connected with the external device and a midsection fixed to the housing.

6. An agitation/deaeration apparatus for simultaneously agitating and deaerating a to-be-kneaded object, comprising,
- a container comprising a container body in which the to-be-kneaded object is to be contained and a support axis fixed to the container body,
- a support member elastically jointed with a housing,
- a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
- a first rotation drive mechanism configured to drive and rotate the revolution table;
- a second rotation drive mechanism configured to drive and rotate the container in a direction reverse to that of the revolution table and at a rotational speed equal to that of the revolution table;
- a supply device configured to supply the to-be-kneaded object to the container;
- a collection device configured to collect the kneaded object from the container;
- a supply tube without a rotary joint, the supply tube having a first end fixed to the container and a second end connected with the supply device and a midsection fixed to the housing; and
- a collection tube without a rotary joint, the collection tube having a first end fixed to the container and a second end connected with the collection device and a midsection fixed to the housing.

7. An agitation/deaeration apparatus for simultaneously agitating and deaerating a to-be-kneaded object, comprising,
- a container comprising a container body in which the to-be-kneaded object is to be contained and a support axis fixed to the container body,
- a support member elastically jointed with a housing,
- a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
- a first rotation drive mechanism configured to drive and rotate the revolution table;
- a second rotation drive mechanism configured to drive and rotate the container in a direction reverse to that of the revolution table and at a rotational speed equal to that of the revolution table;
- a medium passage formed in or provided on the container, through which a heat exchange medium is circulable;
- a medium circulating device configured to cause the heat exchange medium to circulate through the medium passage; and
- a medium distribution tube without a rotary joint, the medium distribution tube having one end fixed to the medium passage, the other end connected with the medium circulating device and a midsection fixed to the housing.

8. An agitation/deaeration apparatus for simultaneously agitating and deaerating a to-be-kneaded object, comprising,
- a container comprising a container body in which the to-be-kneaded object is to be contained and a support axis fixed to the container body,
- a support member elastically jointed with a housing,
- a revolution table for supporting rotatably the container, which is rotatably supported about a revolution axis by the support member and rotates about the revolution axis with the container simultaneously revolving about the revolution axis and rotating relative to the revolution table, the revolution table comprising bearings with which the support axis is supported rotatably,
- a first rotation drive mechanism configured to drive and rotate the revolution table;
- a second rotation drive mechanism configured to drive and rotate the container in a direction reverse to that of the revolution table and at a rotational speed equal to that of the revolution table;
- at least one distribution means without a rotary joint, the distribution means having a first end and a second end, the first end being fixed to the container, the other second being connected with an external device, and a midsection being fixed to the housing.

9. An agitation/deaeration apparatus according to claim 1, wherein the container includes a radiating fin disposed on an outer surface.

10. An agitation/deaeration apparatus according to claim 1, further comprising a thermoregulator configured to regulate an atmospheric temperature around the container.

11. An agitation/deaeration apparatus according to claim 1, the external device is a vacuum pump configured to reduce a pressure in the container.

12. An agitation/deaeration apparatus according to claim 5, the external device is a vacuum pump configured to reduce a pressure in the container.

* * * * *